(12) United States Patent
Lunsman et al.

(10) Patent No.: US 10,750,639 B2
(45) Date of Patent: Aug. 18, 2020

(54) COOLING MEMORY MODULES

(71) Applicant: Hewlett Packard Enterprise Development LP, Houston, TX (US)

(72) Inventors: Harvey J. Lunsman, Chippewa Falls, WI (US); Tahir Cader, Liberty Lake, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/196,372

(22) Filed: Nov. 20, 2018

(65) Prior Publication Data
US 2020/0163253 A1 May 21, 2020

(51) Int. Cl.
| | |
|---|---|
| *H05K 7/20* | (2006.01) |
| *F28F 7/00* | (2006.01) |
| *H05K 1/14* | (2006.01) |
| *G06F 1/20* | (2006.01) |

(Continued)

(52) U.S. Cl.
CPC .......... *H05K 7/20336* (2013.01); *G06F 1/20* (2013.01); *H05K 1/0203* (2013.01); *H05K 1/181* (2013.01); *H05K 7/20254* (2013.01); *H05K 2201/064* (2013.01); *H05K 2201/10159* (2013.01)

(58) Field of Classification Search
CPC ...... H02J 7/025; G06F 1/20; G06F 2200/201; G06F 1/183; G06F 1/206; H05K 7/20772; H05K 7/20236; H05K 7/20218; H05K 7/20336; H05K 7/20509; H05K 7/20763; H05K 7/20318; H05K 7/20836; H05K 1/0203; H05K 1/14; H05K 1/141; H05K 2201/064; H05K 2201/10515; H05K 3/368; H05K 7/20; H05K 7/20154; H05K 7/20727; F28D 1/02; F28D 2021/0028; F28D 15/00; F28D 2021/0029; H01L 23/473; H01L 23/427; H01L 2224/1308; H01L 2023/405; H01L 2023/4062; H01L 2224/1358; H01L 2225/06541; H01L 2225/06589

See application file for complete search history.

(56) References Cited

U.S. PATENT DOCUMENTS 7,106,595 B2   9/2006  Foster et al.
7,151,668 B1 * 12/2006  Stathakis .............. H01L 23/427
                                                    361/700

(Continued)

OTHER PUBLICATIONS

Arthur K. Farnsworth, "Integrated Heat Pipe Spreader for Improved FBDIMM Memory Module Thermal Management," Nov. 1, 2008, pp. 1-15 (online). ITEM Media, Retrieved from the Internet on May 14, 2018 at URL: <electronics-cooling.com/2008/11/integrated-heat-pipe-spreader-for-improved-fbdimm-memory-module-thermal-management/#>.

*Primary Examiner* — Jayprakash N Gandhi
*Assistant Examiner* — Michael A Matey
(74) *Attorney, Agent, or Firm* — Brooks, Cameron & Huebsch, PLLC

(57) ABSTRACT

An example cooling system is described herein. The cooling system can include a first cold plate including a first heat pipe to couple to a side of a dual in-line memory module (DIMM) where the first heat pipe transfers heat from the DIMM to the first cold plate; and a second cold plate including a second heat pipe to couple to the side of the DIMM, where the second heat pipe transfers heat from the DIMM to the second cold plate.

20 Claims, 5 Drawing Sheets

(51) Int. Cl.
*H05K 1/18* (2006.01)
*H05K 1/02* (2006.01)

(56) References Cited

U.S. PATENT DOCUMENTS

| | | | | |
|---|---|---|---|---|
| 7,957,134 | B2* | 6/2011 | Farnsworth | H01L 23/4093 |
| | | | | 257/719 |
| 7,965,509 | B2 | 6/2011 | Campbell et al. | |
| 7,969,736 | B1 | 6/2011 | Iyengar et al. | |
| 8,587,943 | B2 | 11/2013 | Barina et al. | |
| 8,638,559 | B2 | 1/2014 | Barina et al. | |
| 9,158,348 | B2* | 10/2015 | Berk | H01L 23/473 |
| 9,245,820 | B2 | 1/2016 | Goldrian et al. | |
| 10,499,488 | B1* | 12/2019 | Tsai | H05K 1/144 |
| 2008/0084668 | A1* | 4/2008 | Campbell | H01L 23/473 |
| | | | | 361/702 |
| 2009/0080164 | A1* | 3/2009 | Purcell | H05K 1/148 |
| | | | | 361/737 |
| 2009/0277616 | A1* | 11/2009 | Cipolla | F28D 15/0233 |
| | | | | 165/104.33 |
| 2010/0252234 | A1* | 10/2010 | Cambell | H01L 23/473 |
| | | | | 165/80.2 |
| 2011/0069454 | A1* | 3/2011 | Campbell | H05K 7/2079 |
| | | | | 361/700 |
| 2011/0209855 | A1* | 9/2011 | Peterson | G06F 1/20 |
| | | | | 165/104.26 |
| 2012/0020022 | A1* | 1/2012 | Peterson | G06F 1/20 |
| | | | | 361/699 |
| 2012/0026670 | A1* | 2/2012 | Rau | G06F 1/20 |
| | | | | 361/679.31 |
| 2012/0175160 | A1* | 7/2012 | Kadri | G11C 5/066 |
| | | | | 174/260 |
| 2012/0281358 | A1* | 11/2012 | Chainer | H05K 7/20772 |
| | | | | 361/700 |
| 2013/0021746 | A1* | 1/2013 | Campbell | H05K 7/20145 |
| | | | | 361/679.47 |
| 2013/0120926 | A1* | 5/2013 | Barina | H01L 23/4093 |
| | | | | 361/679.32 |
| 2013/0135812 | A1* | 5/2013 | Barina | H01L 23/427 |
| | | | | 361/679.32 |
| 2013/0322027 | A1* | 12/2013 | Yang | G06F 1/20 |
| | | | | 361/736 |
| 2015/0181746 | A1* | 6/2015 | Mullen | G06F 1/183 |
| | | | | 361/679.31 |
| 2018/0063998 | A1* | 3/2018 | Aoki | H05K 7/20763 |
| 2019/0281719 | A1* | 9/2019 | Geng | H05K 7/12 |

* cited by examiner

COOLING MEMORY MODULES

BACKGROUND

Computing devices can utilize liquid cooling systems that can circulate a liquid, such as water, throughout the computing device to cool heat generating devices such as processors, memory resources, and/or other electrical components. Different components of the computing device can generate different quantities of heat. In some examples, components that provide a relatively higher performance can also generate a relatively greater quantity of heat. In some examples, computing devices can utilize relatively higher performing components within the same or similar footprint, which can generate a greater quantity of heat within the same or similar footprint.

DETAILED DESCRIPTION

Figure 1:
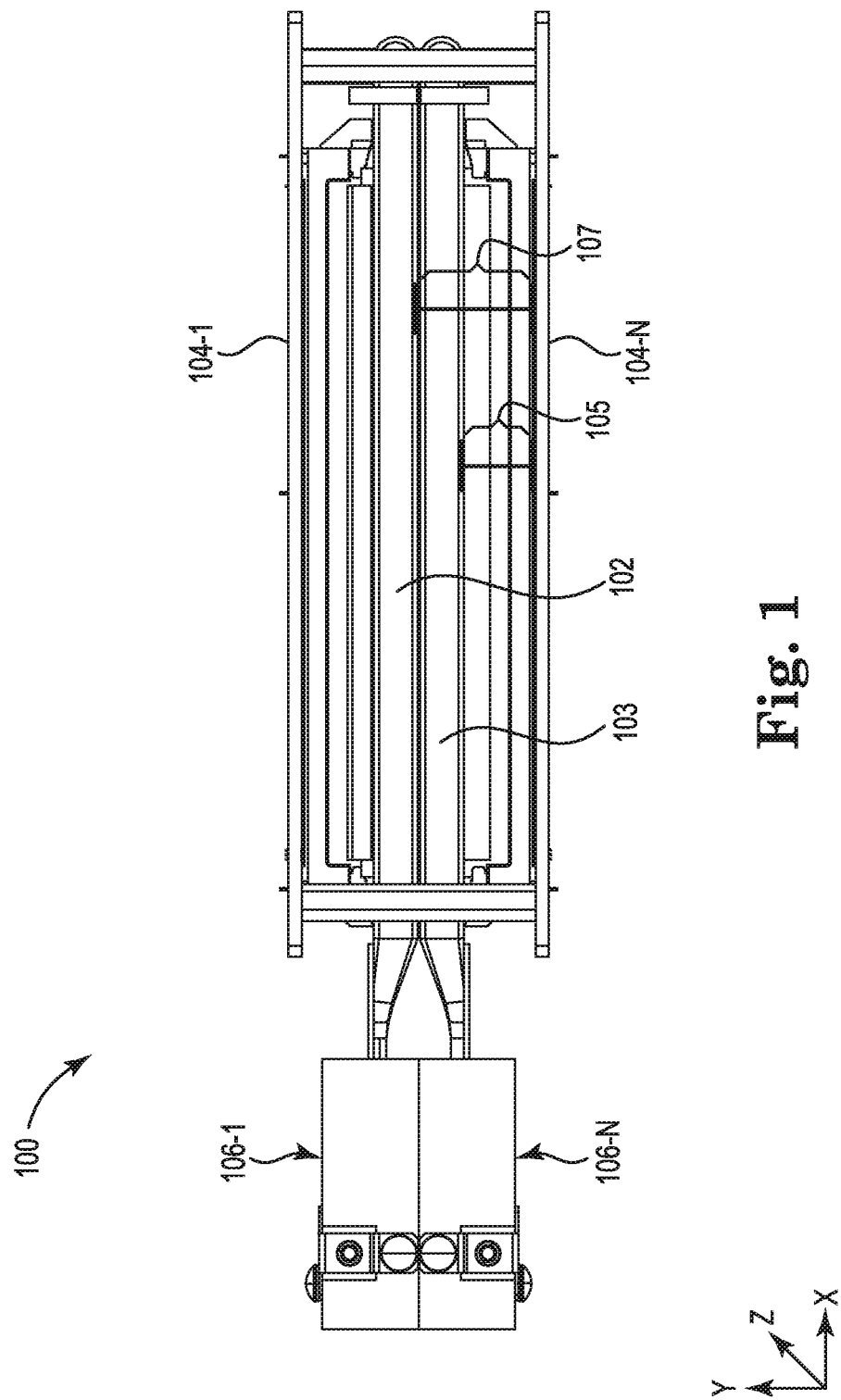
FIG. 1 illustrates an example cooling system consistent with the present disclosure.

A cold plate can be is a device that can be utilized to remove heat from a computing device or component of a computing device. In particular, a cold plate can include a thermally conductive material that can transfer heat away from components of the computing device and into a liquid of a liquid cooling loop. The liquid, such as water or coolant can transfer the heat away from components of the computing device. For example, the cold plate can include a coolant channel through which water or another coolant flows such that the liquid can contact and absorb heat from the conductive material of the cold plate. In this example, the heat of the components can be transferred to the water or coolant and the coolant channel can move the water or coolant away from the components to a location to reject the heat.

In some examples, the cold plate can be coupled to a printed circuit board (PCB) or printed circuit assembly (PCA) of the computing device. As used herein, a PCB or PCA refers to a device that can mechanically support and/or electrically connect the components of a computing device. In some examples, a PCB or PCA can utilize a plurality of conductive tracks, pads, and/or other features etched from one or more sheet layers of a conductive substrate like copper laminated onto and/or between sheet layers of a non-conductive substrate. In some examples, the cold plate can be coupled to a main PCB or motherboard of the computing device.

In some examples, the cold plate can be positioned over a PCB of the computing device and/or the computing device mounted to a PCB. In some examples, the coolant channels of the cold plate can be routed over a plurality of different components of the computing device. For example, a coolant channel of the cold plate can be routed over a central processing unit (CPU) of the computing device. In some examples, the cold plate can include coolant channels that include an embedded heat spreader (e.g., embedded heat plate, embedded metallic heat spreader, etc.). In some examples, the embedded heat spreader can be utilized to transfer heat from an exterior area of the coolant channel into the water or coolant within the coolant channel.

A number of systems and devices for cold plates are described herein. In some examples, a cold plate can remove heat from a computing device or component of a computing device using heat pipes. In some examples, cold plates can be utilized to cool memory modules including memory resources such as dual in-line memory modules (DIMMs) which can be connected to multiple PCBs. As used herein, a memory module refers to a circuit board that on which memory integrated circuits can be mounted. In some examples, a memory module can include DRAM integrated circuits that are installed into the memory slot on a computer motherboard. For example, a memory module can be a DIMM. As used herein, a DIMM refers to a memory resource that contains random access memory (RAM) chips on a circuit board. For example, a DIMM can include pins which connect the DIMM to a PCB to provide memory resources to the PCB. When multiple PCBs are positioned in a stacked orientation, the DIMMs corresponding to each PCB can be interleaved between the multiple PCBs. As used herein, the term "interleaved" refers to a pattern where every other device corresponds to a different support.

For example, a first PCB can support multiple DIMMs, a second PCB can support multiple DIMMs and the first and the second PCBs can be stacked such that their respective DIMMs are interleaved between the stacked PCBs. A cold plate coupled to a plurality of heat pipes can transfer heat away from the interleaved DIMMs toward each cold plate utilizing heat pipes. For example, the cold plates can include sets of heat pipes coupled to the DIMMs to transfer heat from the DIMM into the cold plate. The examples described herein can improve the cooling of multiple DIMMs by utilizing multiple orientations of cold plates. In some examples, the heat pipes can be flat heat pipes. As used herein, a flat heat pipe refers to a heat pipe with a first flat side and a second flat side. This can differ from tubular heat pipes, which can be cylindrical in shape. In some examples described herein, flat heat pipes can be molded into a cold plate to remove heat from the DIMMs of a computing device.

In some examples, the cold plates can be positioned in a stacked orientation providing the stacked PCBs a unidirectional heat flow toward the stacked cold plates. In another example, the cold plates can be positioned opposite each other with the stacked PCBs and interleaved DIMMs positioned between the cold plates. In both orientations, each cold plate can include a set of heat pipes which can contact each DIMM. In some examples, the plurality of DIMMs can be positioned between a plurality of PCBs. In this example, a first cold plate can be located on the opposite end of the PCB as a second cold plate. In this example, a first heat pipe can transfer heat from a DIMM to a first cold plate, while a second heat pipe can transfer heat from the DIMM to a second cold plate.

Because the DIMMs of each PCB are positioned in an interleaved pattern, each DIMM will be in contact with a heat pipe corresponding to each cold plate. Examples described herein can provide increased resiliency and more evenly distributed cooling as each DIMM is in contact with multiple heat pipes corresponding to different cold plates comprising multiple fluid conduits and multiple heat spreaders.

FIG. 1 illustrates an example cooling system 100 consistent with the present disclosure. As illustrated in FIG. 1, the cooling system 100 can comprise a plurality of cold plates 106-1 and 106-N, which can be collectively referred to as the plurality of cold plates 106, thermally conductive plastic material, a plurality of heat pipes comprising a heat pipe 102, and a heat pipe 103, and a plurality of PCBs 104-1, and 104-N which can be collectively referred to as the plurality of PCBs 104.

Although not illustrated in FIG. 1 as to not obscure the examples of the disclosure, the heat pipe 102 can be a portion of a set of heat pipes comprising a plurality of heat pipes 102 coupled to a first cold plate 106-1. Likewise, although not illustrated in FIG. 1 as to not obscure the examples of the disclosure, the heat pipe 103 can be a portion of a set of heat pipes comprising a plurality of heat pipes 103 coupled to a second cold plate 106-N. The sets of heat pipes are illustrated and described in further detail in connection with FIG. 2.

In some examples, the plurality of cold plates 106 can be made of a thermally conductive plastic material. Utilizing thermally conductive plastic can reduce the overall weight of the plurality of cold plates 106. For example, the thermally conductive plastic material can be relatively lighter than other conductive materials such as aluminum or copper. The plurality of cold plates 106 can include condenser plates that can be utilized to couple the plurality of heat pipes 102 to the exterior surface of the cold plate 106. That is, the heat pipes are connected to the condenser plates, and the condenser plates are coupled to the plurality of cold plates 106.

As used herein, the term "heat pipe" refers to a heat-transfer device that utilizes heat conduction and phase change to transfer heat from a first location to a second location. As mentioned herein, heat pipes can have various shapes (e.g., cylindrical, flat, etc.). Some shapes of heat pipes may not be capable of being molded into the thermally conductive plastic of the plurality of cold plates 106. For example, a molding process can generate a quantity of pressure during the molding process that can damage a heat pipe of a various shapes (e.g., round, oblong, cylindrical, etc.). A heat pipe including a first flat side and a second flat side (e.g., a flat heat pipe) can be able to withstand the pressure caused by a molding process. For example, the plurality of heat pipes 102 and 103 can be flat heat pipes that can withstand the pressure generated by molding a thermally conductive plastic into the plurality of cold plates 106 structure. In other words, the flat shape of the flat heat pipe can prevent damage to the flat heat pipes from being damaged when they are molded into the thermally conductive plastic material of the plurality of cold plates 106. In some examples, the plurality of heat pipes 102 and 103 can include a rounded portion where the heat pipes contact the DIMMs and a flat surface where the plurality of heat pipes 102 and 103 can attach to the plurality of cold plates 106.

The plurality of cold plates 106 can also include a coupling location that can be utilized to couple the plurality of heat pipes 102 and 103 directly to the surface of the plurality of cold plates 106. For example, the heat pipes 102 and 103 can transfer heat from heat generating devices (e.g., a DIMM) into a coolant channel via the coupling location of the plurality of cold plates. Although not shown in FIG. 1 as to not obscure examples of the disclosure, there can be a DIMM within a computing device as shown in further detail in FIG. 2. The heat transported from the heat pipes 102 and 103 can be transferred into the coolant channel such that a liquid within the coolant channel can remove heat from the heat pipes 102 and 103. In this way, heat pipes 102 and 103 can transfer heat from the DIMM to the liquid within a coolant channel of the plurality of cold plates 106 without being molded into the thermally conductive plastic of the plurality of cold plates 106.

In some examples, the heat pipes 102 and 103 can include a liquid material enclosed by a conductive material. The liquid material can be converted to a gas at a particular temperature. For example, a heat generating device such as a DIMM can exceed the particular temperature and covert the liquid to a gas within the conductive material of the plurality of heat pipes 102 and 103. In this example, the gas produced within the heat pipes 102 and 103 can travel within the heat pipes 102 and 103 toward the plurality of cold plates 106. In this example, the heat can be removed from the heat pipes 102 and 103 and transferred into the liquid within the coolant channel (not shown in FIG. 1 as to not obscure examples of the disclosure, there can be a coolant channel as shown in further detail in FIG. 3) inside the plurality of cold plates 106.

In some examples, the plurality of cold plates 106 can include corresponding heat spreaders that can be utilized to transfer heat from the plurality of heat pipes 102 and 103 into a liquid within the coolant channels of the plurality of cold plates 106. In this way, the plurality of cold plates 106 can be utilized to remove heat from a DIMM positioned within a DIMM socket. As used herein, a DIMM socket refers to a connector to provide electrical connection between a PCB of a computing device and the DIMM.

As mentioned, the cooling system 100 can comprise a plurality of DIMMs connected to a plurality of PCBs 104. In some examples, there can be a plurality of the PCBs 104 with DIMMs coupled to PCB 104-1 and 104-N. For example, the DIMMs can be positioned in between the plurality of PCBs 104, where the DIMMs of a first PCB 104-1 are interleaved with the DIMMs of a second PCB 104-N. This interleaved arrangement is illustrated in detail in connection with FIG. 2. To provide cooling to memory modules coupled to the plurality of PCBs 104, the heat pipes 102 and 103 can be positioned on multiple sides of a DIMM.

For example, in the cooling system 100, the heat pipes 102 and 103 can be positioned on either side of a DIMM to remove heat from a DIMM positioned within a DIMM socket. In some examples, the plurality of heat pipes 102 and 103 can be utilized to transfer heat from the DIMM to the plurality of cold plates 106. For example, the first heat pipe 102 can be a portion of a first set of heat pipes coupled to the first cold plate 106-1 and the second heat pipe 103 can be a portion of a second set of heat pipes 103 coupled to the second cold plate 106-N. In these examples, the plurality of heat pipes 102 and 103 can be utilized to transfer heat from the DIMMs coupled to the plurality of PCBs 104 to their respective cold plate 106-1 and 106-N.

As illustrated in FIG. 1, the plurality of PCBs 104 are in a stacked orientation. As used herein, the terms "stack," or "stacked" refers to an object oriented on top of another object. As illustrated in FIG. 1, the PCB 104-1 is stacked on top of the PCB 104-N. Because the plurality of PCBs 104 are in a stacked orientation, the DIMMs coupled to the PCBs 104 are interleaved such that the heat pipes 102 and 103 can transfer heat from DIMMs corresponding to both PCBs 104-1 and 104-N. Said differently, the PCB 104-1 can include DIMMs that interleave with the DIMMs included in the PCB 104-N such that the DIMMs are positioned between the stacked plurality of PCBs 104. As such, the heat pipe 102 can transfer heat from the DIMM of the PCB 104-1 and 104-N to the liquid within the cold plate 106-1, and the heat pipe 103 can transfer heat from the DIMM of the PCBs 104-1 and 104-N to the liquid within the cold plate 106-N. Specifically, a first cold plate 106-1 can include a first heat pipe 102 coupled to a side of the DIMM (corresponding to either PCB 104-1 or 104-N). In this example, a second cold plate 106-N can include a second heat pipe 103 and the second heat pipe 103 can be coupled to the side of the DIMM.

As used herein, the terms "in contact," "connected to", or "coupled to" is intended to mean that the element can be directly in contact, connected, or coupled with the other element or intervening elements can be present. That is, the first cold plate 106-1 can be connected to a first heat pipe 102 and a second cold plate 106-N can be connected to the second heat pipe 103. The first heat pipe 102 and the second heat pipe 103 can be coupled to the same DIMM. That is, the first heat pipe 102 and the second heat pipe 103 can be coupled to the same DIMM but different cold plates 106. As illustrated in FIG. 1, a first PCB 104-1 can be parallel to a second PCB 104-N, while the first PCB 104-1 and the second PCB 104-N can be perpendicular to the DIMM. As used herein, parallel is intended to mean to be positioned adjacent to one another and having the substantially same distance continuously between them such that they do not intersect or touch. The first PCB 104-1 can be substantially horizontally parallel to the second PCB 104-N. In this example, the first PCB 104-1 can be substantially parallel to the second PCB.

As used herein, the term "substantially" is intended to mean that the characteristic may not be absolute but is close enough so as to achieve the characteristic. For example, "substantially parallel" is not limited to absolute parallelism and can include orientations that are intended to be parallel but due to manufacturing limitations may not be precisely parallel. For example, "substantially parallel" features are closer to a parallel orientation than a perpendicular orientation, and generally are formed within a few degrees of parallel. Similarly, "substantially perpendicular" is not limited to absolute perpendicularity and can include orientations that are intended to be perpendicular but due to manufacturing limitations may not be precisely perpendicular. For example, "substantially perpendicular" features are closer to a perpendicular orientation than a parallel orientation, e.g., within a few degrees of perpendicular.

For example, a first heat pipe 102 can be parallel to the second heat pipe 103. In this example, the first heat pipe 102 and the second heat pipe 103 can be stacked on top of each other and extend in a substantially parallel orientation in a positive x-direction while coupled to the side of the DIMM. The first heat pipe 102 can be substantially parallel to the second heat pipe 103. In this way, the DIMMs can also extend the length of the stacked plurality of PCBs 104 in a positive x-direction and can contact both the first heat pipe 102 and the second heat pipe 103 and eliminate the generated heat from the DIMM into respective cold plates 106-1 and 106-N.

As indicated by the coordinate plane shown in FIGS. 1, 2, 3, 4, and 5 a positive x-direction can refer to a direction toward the right of the page, a positive z-direction can refer to a direction out of the page, and a positive y-direction can refer to a direction toward the top of the page. A negative x-direction can refer to a direction toward the left of the page, a negative z-direction can refer to a direction into the page, and a negative y-direction can refer to a direction toward the bottom of the page. In this example, the DIMMs and heat pipes 102 and 103 can extend in a positive x-direction along the length of the stacked plurality of PCBs 104. In another example, the DIMMs and heat pipe 102 and 103 can extend in a negative x-direction along the length of the stacked plurality of PCBs 104.

As illustrated in FIG. 1, the first cold plate 106-1 can be stacked on top of the second cold plate 106-N, and the first PCB 104-1 and the second PCB 104-N can also be positioned in a stacked orientation. Here, the plurality of cold plates 106 can be stacked on top of each other. That is, the first cold plate 106-1 can be on top of the second cold plate 106-N. The heat pipes 102 and 103 can extend from the plurality of cold plates 106 such that the first heat pipe 102 is stacked on top of the second heat pipe 103. For example, the first heat pipe 102 can be positioned at a first height 107 on the side of the DIMM and the second heat pipe 103 can be positioned at a second height 105 on the side of the DIMM. In other words, the first heat pipe 102 can be coupled to the DIMM at a first height 107 relative to the plurality of PCBs 104 while the second heat pipe 103 can be coupled to the DIMM at a second height 105 relative to the plurality of PCBs 104. Specifically, a first heat pipe 102 can be coupled to the DIMM at a first height 107 from a first PCB 104-1 while a second heat pipe 103 can be coupled to the DIMM at a second height 105 from the first PCB 104-1, where the first heat pipe 102 and the second heat pipe 103 are substantially parallel to each other.

Examples of cooling memory modules coupled to printed circuit boards described in connection with FIG. 1 describes cooling memory modules coupled to a plurality of PCBs 104 with interleaved DIMMs. Cold plates 106 can be in a stacked orientation such that a set of heat pipes extending from each cold plate can include a first heat pipe 102 and a second heat pipe 103. Since the first heat pipe 102 corresponds to a first cold plate 106-1, and a second heat pipe 103 corresponds to a second cold plate 106-N, each DIMM can be cooled by both the first cold plate 106-1 and the second cold plate 106-N. This can provide resiliency to the cooling of memory modules coupled to PCBs because in an event where an individual cold plate is damaged or otherwise impaired, the other can compensate to provide cooling to memory modules coupled to the plurality of PCBs 104.

Figure 2:
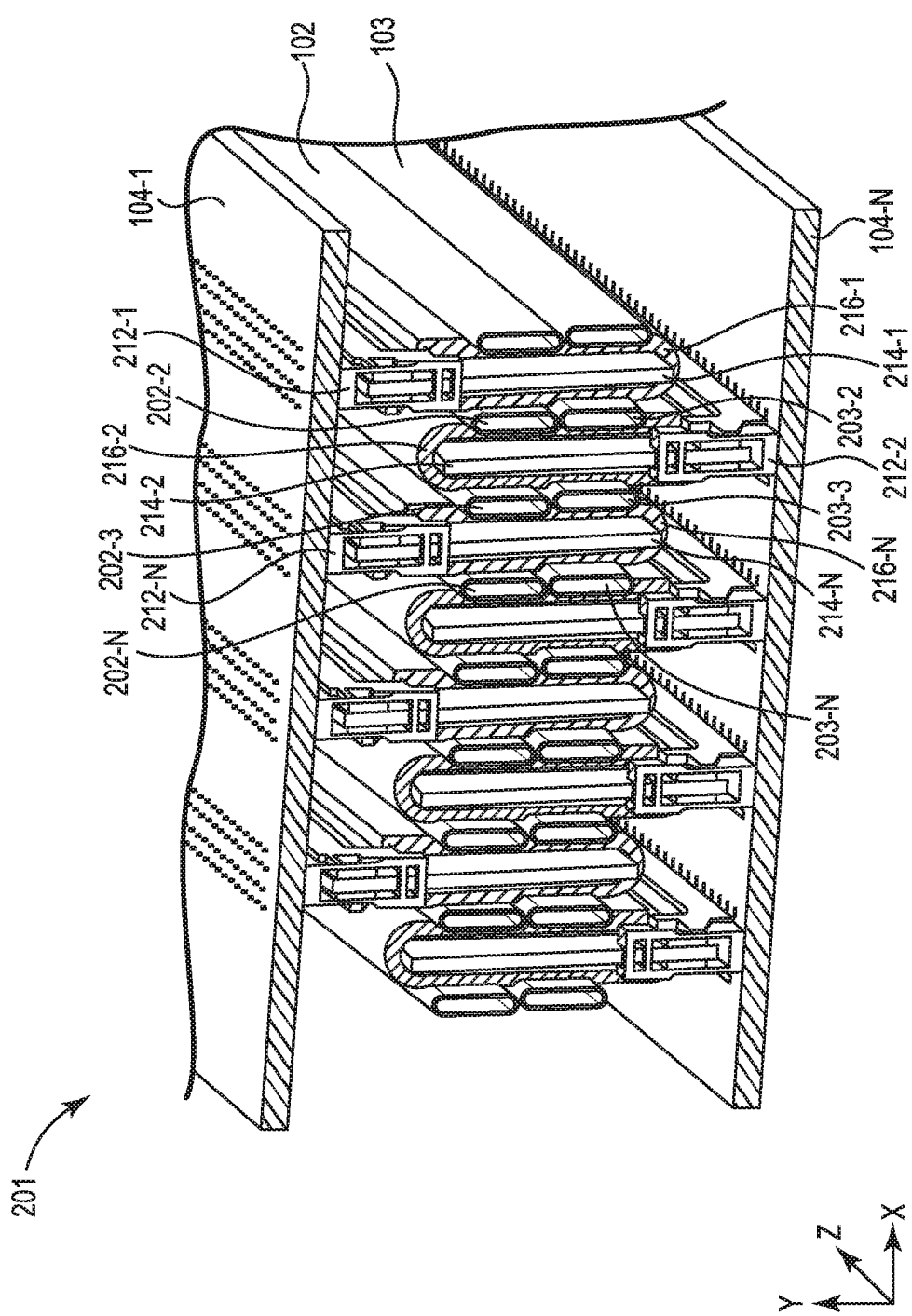
FIG. 2 illustrates a cross section of an example computing device consistent with the present disclosure.

FIG. 2 illustrates a cross section of a computing device 201 consistent with the present disclosure. The computing device 201 can include the same or similar elements as the example cooling system 100 as referenced in FIG. 1. For example, the computing device 201 can include a first set of heat pipes and a second set of heat pipes. The first set of heat pipes comprising, a plurality of flat heat pipes 102, 202-2, 202-3, and 202-N, which can be collectively referred to as the plurality of heat pipes 202, and/or the first set of heat pipes 202. Likewise, the computing device 201 can include the second set of heat pipes comprising a plurality of heat pipes 103, 203-2, 203-3, and 203-N which can be collectively referred to as the plurality of heat pipes 203, and/or the second set of heat pipes 203. The computing device 201 includes a plurality of PCBs 104-1 and 104-N which are illustrated in a stacked orientation. A plurality of DIMMs 214-1, 214-2, and 214-N, which can be collectively referred to herein as the plurality of DIMMs 214 can be interleaved between the plurality of PCBs 104.

As illustrated in FIG. 2, the DIMMs 214-1, 214-2, and 214-N are interleaved. For example, DIMM 214-1 corresponding to PCB 104-1 is interleaved with DIMM 214-2 corresponding to PCB 104-N and DIMM 214-N again corresponding to PCB 104-1. The interleaving orientation of the plurality of DIMMs 214 corresponding to the respective PCBs 104 can position the first set of heat pipes 202 and the second set of heat pipes 203 to remove heat from the first DIMM 214-1 to their corresponding cold plates. FIG. 2 illustrates multiple DIMMs, heat pipes, etc. that are unlabeled as to not obscure the examples discussed herein.

The plurality of DIMMs 214 can correspond to a plurality of DIMM sockets 212-1, 212-2, and 212-N, collectively referred to herein as the plurality of DIMM sockets 212, and each of the plurality of DIMMs 214 can be enveloped in a gap pad 216 of a plurality of gap pads 216-1, 216-2, and 216-N, which can be collectively referred to herein as the gap pads 216 and/or the plurality of gap pads 216. In some examples, the plurality of gap pads 216, can be wrapped around the plurality of DIMMs 214 and the plurality of heat pipes 202 and 203. In another example, the gap pads 216 can be wrapped around the plurality of flat heat pipes 202, 203. In yet another example, the gap pads 216 can be wrapped around both the plurality of flat heat pipes 202, 203, and the plurality of DIMMs 216.

As illustrated in FIG. 2, the plurality of PCBs 104 can be coupled to a portion of the plurality of DIMMS 214. For example, the DIMM socket 212-2 corresponds to the DIMM 214-2 such that the DIMM 214-2 is interleaved between the 214-1 and DIMM 214-N. The interleaving of the DIMMs 214 via their corresponding DIMM sockets 212 position the DIMMs 214 corresponding to each PCB 214 to be interleaved when the PCBs 104 are in the stacked orientation.

For example, a first portion of a plurality of DIMMs 214-1, and 214-N can be coupled to the first PCB 104-1 and a second portion 214-2, of the plurality of DIMMs 214 can be coupled to a second PCB 104-N such that the first portion 214-1 and 214-N of the plurality of DIMMs 214 alternate with the second portion 214-2 of the plurality of DIMMs 214. In other words, the plurality of DIMMs 214 are interleaved between the stack of PCBs 104 in an every-other pattern. In this example, the interleaved orientation of the plurality of DIMMs 214 can provide uniform cooling to the plurality of PCBs 104 because the plurality of heat pipes 202 and 203 can fit between the DIMMs 214 such that the DIMMs 214 are cooled from both sides. In some examples, each DIMM of the plurality of DIMMs 214 can be cooled from an individual side. For example, DIMM 214-1 can be cooled by the heat pipes (102, 103) and not be cooled from 202-2 and 203-2. Similarly, the DIMM 214-1 can be cooled by the heat pipes (202-2, 203-2) and not be cooled by the heat pipes 102 and 103.

The plurality of DIMMs 214 connected to first PCB 104-1 can be interleaved with the plurality of DIMMs 214 connected to a second PCB 104-N. The first PCB 104-1 can be stacked on top of the second PCB 104-N such that their respective DIMMs are interleaved between the stacked PCBs 104. For example, the first PCB 104-1 can be coupled to a first DIMM 214-1 and a second DIMM 214-N. A second PCB 104-N can be coupled to a third DIMM 214-2, wherein the first PCB 104-1 can be positioned on top of the second PCB 104-N and the third DIMM 214-2 can be positioned between the first DIMM 214-1 and the second DIMM 214-N. That is, the first PCB 104-1 and the second PCB 104-N can be stacked such that a first DIMM 214-1 and a second DIMM 214-N, which are connected to a first PCB 104-1 are interleaved with a third DIMM 214-2, which is connected to the second PCB 104-N.

As mentioned, the plurality of DIMMs 214 can be connected to the plurality of PCBs 104 by a plurality of DIMM sockets 212 to position the DIMMs 214 in an interleaved position, accompanied by the first set and the second set of heat pipes 202 and 203. For example, DIMM 214-1 is accompanied by heat pipes 102 and 202-2 at a first height (e.g. height 107) and accompanied by heat pipes 103 and 203-2 at a second height (e.g. height 105). As such, the plurality of DIMMs 214 can be accompanied by a plurality of heat pipes 202 and 203 so that the plurality of heat pipes 202 and 203 can remove heat from a plurality of DIMMs 214 coupled to the plurality of PCBs 104. In this way, the plurality of heat pipes 202 and 203 can remove heat generated by the plurality of DIMMs 214 coupled to the plurality of corresponding DIMM sockets 212. The heat removed by the heat pipes 202 and 203 can be transferred to a plurality of cold plates.

For example, a first cold plate (e.g., the first cold plate 106-1) coupled to the first set of heat pipes 202, can accept the heat from the plurality of DIMMs 214 where the heat removed by the first set of heat pipes 203 is transferred to the first cold plate. Likewise, a second cold plate (e.g., the second cold plate 106-N) coupled to the second set of heat pipes 203, can accept the heat from the plurality of DIMMs 214 where the heat removed by the second set of heat pipes 203 is transferred to the second cold plate.

Multiple heat pipes (e.g., heat pipes 202-2, 202-3, 203-2 and 203-3) around an individual DIMM (e.g., the DIMM 214-2) allows for improved cooling resiliency/redundancy. Also, if an individual heat pipe surrounding the individual DIMM is damaged and/or compromised, a different heat pipe can still provide cooling to an extent that can mitigate the risk of damaging the DIMM. In some examples, the plurality of heat pipes 202 and 203 can transfer the heat generated by the plurality of DIMMs 214 to a corresponding cold plate as described in connection with FIG. 1. Although not shown in FIG. 2 as to not obscure examples of the disclosure, there can be a plurality of cold plates (e.g., 106-1 and 106-N) as described in connection with FIG. 1.

In some examples, the first set of heat pipes 202 and the second set of heat pipes 203 can extend a length of the plurality of PCBs 104 to provide a uniform cooling of the first DIMM 214-1 and third DIMM 214-2. That is, the length of the plurality of heat pipes 202 and 203 can be substantially the same as the length of the plurality of PCBs 104. For example, the DIMMs 214 and heat pipes 202 and 203 can extend along the z axis and/or the length of the stacked plurality of PCBs 104. This uniformity of length can provide a uniformity of cooling to the plurality of DIMMs 214 connected all along the PCBs 104. As such, the DIMMs 214-1, and 214-N can be connected to a first PCB 104-1 to receive a uniform cooling along the length of the DIMMs 214-1, and 214-N. Likewise, the DIMM 214-2 can be connected to the PCB 104-N and receive a uniform cooling along the length of the DIMM 214-2.

In some examples, a first individual heat pipe 102 from the first set of heat pipes 202 can be on a side of the first DIMM 214-1 at a first distance (e.g., the distance 107), and a second individual heat pipe 103 from the second set of heat pipes 203 can be parallel to the first individual heat pipe 102 and at a second distance (e.g., the distance 105) on the side of the first DIMM 214-1. In other words, a first heat pipe 102 can be parallel to a second heat pipe 202-2.

In some examples, the plurality of cold plates can be positioned on opposite sides of the plurality of PCBs 104, such that the plurality of heat pipes 202 and 203 can direct heat in different directions (discussed in further detail in connection with FIG. 4). For example, the first set of heat pipes 202 and the second set of heat pipes 203 can direct heat from the first 214-1 and the third 214-2 DIMMs in opposite directions towards a first cold plate and a second cold plates coupled to the first 104-1 and the second PCB 104-N.

In some examples, the plurality of heat pipes 202 and 203 can direct heat to multiple cold plates positioned in various orientations. For example, the first set of heat pipes 202 can direct heat to multiple cold plates positioned on opposite sides of the plurality of PCBs 104. In this way, the first set of heat pipes 202 can transfer heat in opposite directions to two different cold plates. Said differently, each heat pipe of the first set of heat pipes 202 can transfer heat to two cold plates. Similarly, when a plurality of cold plates 106 are in a stacked orientation (e.g., FIG. 1) the plurality of heat pipes 202 can transfer heat to both cold plates included in the stack. As such, both the first set and the second set of heat pipes 202 and 203 can transfer heat to an individual cold plate or to multiple cold plates. Furthermore, the first set of heat pipes 202 can transfer heat to multiple cold plates (in a stacked orientation or positioned opposite the plurality of PCBs 104 as illustrated in FIG. 4) while the second set of heat pipes 203 transfers heat to an individual cold plate (e.g., the first cold plate 106-1) and refrains from transferring heat to another cold plate (e.g., the second cold plate 106-N), and vice versa.

In some examples, the heat pipes can transfer heat from two DIMMs at the same instance. For example, the individual heat pipe 202-2 and the individual heat pipe 203-2 are between the first DIMM 214-1 and the third DIMM 214-2 such that the individual heat pipes 202-2 and 203-2 remove heat from the first DIMM 214-1 and the third DIMM 214-2 in opposite directions when the cold plates are disposed on opposite sides of the plurality of PCBs 104 (as further described in connection with FIG. 4).

In some examples, the first cold plate (e.g., cold plate 106-1 of FIG. 1) can be coupled to the first set of heat pipes 202. In this example, the first set of heat pipes 202, can remove heat from the plurality of DIMMs 214 and can transfer it to the first cold plate. A second cold plate (e.g., the second cold plate 106-N of FIG. 1) can be coupled to the second set of heat pipes 203. In this example, the second set of heat pipes 203, can remove heat from the plurality of DIMMs 214 and can transfer the heat to a second cold plate. That is, the first set of heat pipes (102, 202-2, 202-3, and 202-N) of the plurality of heat pipes 202 attached to the DIMMs 214-1, 214-2, 214-N can transfer heat to a first cold plate and the second set (103, 203-2, 203-3, and 203-N) of the plurality of heat pipes 203 attached to the DIMMs 214-1, 214-2, 214-N can transfer heat to a second cold plate. As mentioned the computing device 201 can include a plurality of gap pads 216, which can facilitate the interleaved orientation of the plurality of DIMMs 214. In some examples, the plurality of DIMMs 214 can be interleaved without presence of the plurality of gap pads 216.

For example, the plurality of DIMMs 214 can include a plurality of gap pads 216 to enhance the cooling of the DIMMs. Each individual gap pad can be positioned around a surface of the side of the plurality of DIMM 214 to provide a cushion between an individual DIMM and the heat pipes surrounding the individual DIMM. The gap pad 216 can be thermally conductive, to facilitate the transfer of heat from the plurality of DIMMs 214 to plurality of heat pipes 202. In some examples, a metal spring jacket with spring features (not shown) can be used in place of the plurality of gap pads 216. The metal spring jacket can be positioned between an individual DIMM and the heat pipes surrounding the individual DIMM.

In some examples, the plurality of gap pads 216 can have a low Young's Modulus which can allow for the plurality of heat pipes 202 to compress multiple gap pads 216 simultaneously without a high DIMM insertion force (which can damage the heat pipes). This can ensure adequate surface contact with the uneven and variable surfaces of different DIMMs 214. The plurality of gap pads 216 can have a tear-resistant outer lining to allow for the plurality of heat pipes 202 and 203 to slide past the gap pads 216 while compressing them without tearing them. The outer lining can also have a low coefficient of friction to allow for the plurality of heat pipes 202 and 203 to slide over them. For example, the plurality of gap pads 216 can have, but not be limited to, a compression of 25-33%.

In some examples, the plurality of gap pads 216 can be attached to the plurality of DIMMs 214. As such, the plurality of gap pads 216 are interleaved with the plurality of DIMMs. In some examples, the plurality of gap pads 216 can be a continuous material attached to the plurality of DIMMs 214. In some examples, the plurality of gap pads 216 can be disjointed where the plurality of DIMMs 214 are not connected to the PCBs 104. For example, a first gap pad 216-1 can be disjointed on the bottom of a first DIMM 214-1 because the DIMM 214-1 is connected to a first PCB 104-1 at the top of the DIMM. In this example, a second gap pad 216-6 can be disjointed on the top of a second DIMM 214-2 because the DIMM 214-2 is connected to a second PCB 104-N at the bottom of the DIMM. In another example, the plurality of gap pads 216 can be can two individual pieces on each side of the plurality of DIMMs 214. That is, gap pad 216-1 would be two unconnected pieces, the first gap pad in a positive x-direction of the DIMM 214-1 and the second gap pad in a negative x-direction of the DIMM 214-1.

Examples of cooling memory modules coupled to printed circuit boards described in connection with FIG. 2 describes cooling a plurality of PCBs 104 with interleaved DIMMs 214. A plurality of DIMMs 214 are connected to the plurality of PCBs 104 via DIMM sockets 212. Each DIMM has a plurality heat pipes coupled to it. For example, heat pipes 102, 103, 202-2, and 203-2 are coupled to an individual first DIMM 214-1. Heat pipes 102 and 103 are coupled to the first DIMM 214-1 on a first side while heat pipes 202-2 and 203-2 are coupled to the first DIMM 214-1 on an opposite side. The multitude of heat pipes around an individual DIMM allows for improved cooling resiliency/redundancy. Also, if one heat pipe is damaged and/or compromised, the other heat pipe can still provide cooling to an extent that at least would mitigate the risk of damaging the DIMMs themselves. As such, a DIMM can have one flat heat pipe or up to a maximum of N flat heat pipes per DIMM. The increased number of flat heat pipes can reduce cost for lower power DIMM cooling or increase performance for high power DIMMs.

Figure 3:
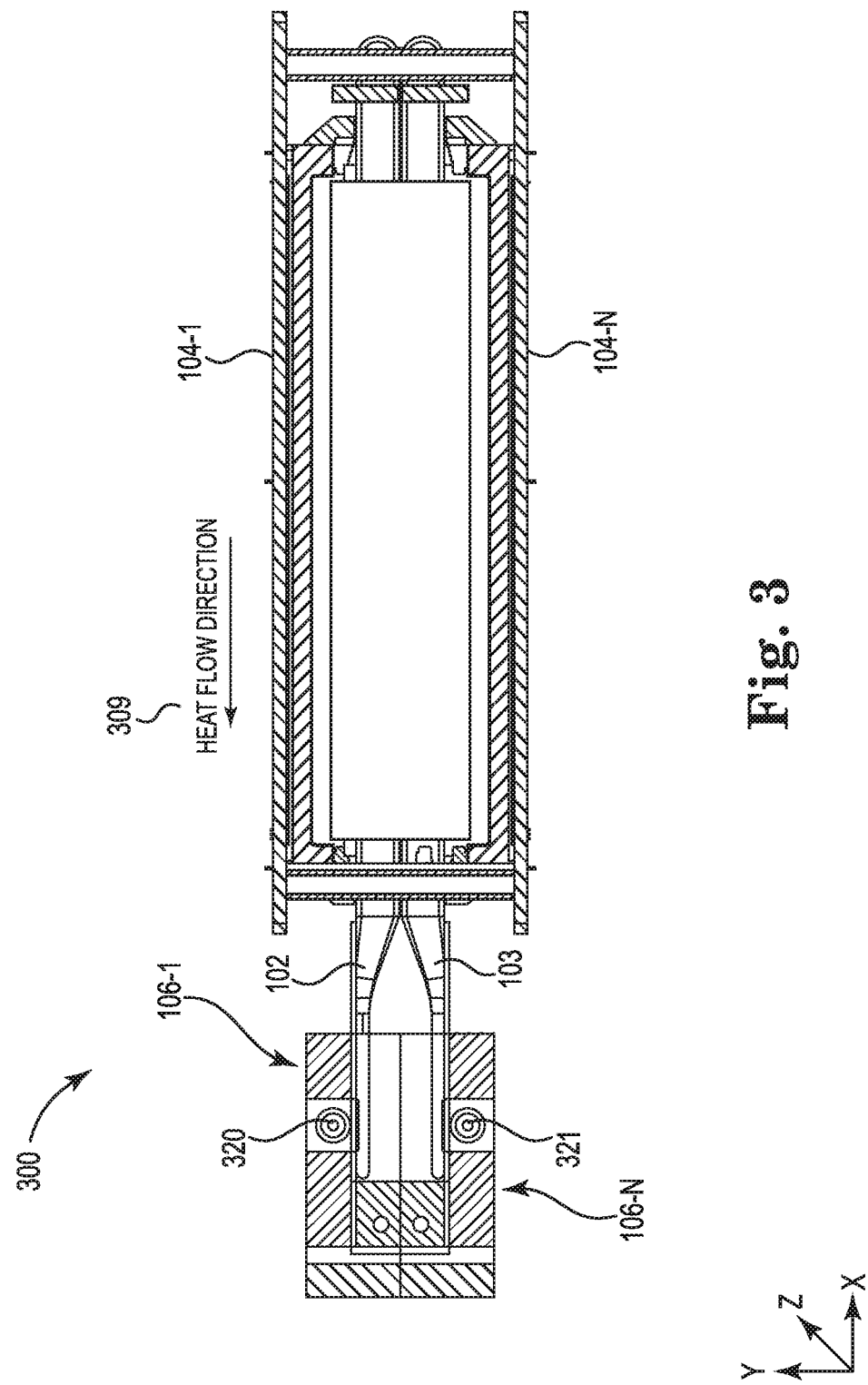
FIG. 3 illustrates an example of a directional cooling system consistent with the present disclosure.

FIG. 3 illustrates an example of a directional cooling system 300 consistent with the present disclosure. The cooling system 300 can include the same or similar elements as cooling system 100 referenced in FIG. 1 and/or computing device 201 referenced in FIG. 2. For example, the cooling system 300 can comprise a plurality of cold plates 106-1 and 106-N, which can be collectively referred to as the plurality of cold plates 106, attached to a plurality of flat heat pipes 102 and 103, coupled to a plurality of DIMMs (e.g., the DIMMs 214 of FIG. 2) disposed between a plurality of PCBs 104-1 and 104-N which can be collectively referred to as the plurality of PCBs 104. The plurality of cold plates 106 can be made of thermally conductive plastic material that forms a coolant channel 320 and 321, which can be collectively referred to as the plurality of coolant channels 320, 321. The cooling system 300 can be a representation of a side view of cooling system 100 as referenced in FIG. 1 and/or computing device 201 as referenced in FIG. 2.

Although not illustrated in FIG. 3 as to not obscure the examples of the disclosure, the heat pipe 102 can be a portion of a set of heat pipes comprising a plurality of heat pipes 102 coupled to a first cold plate 106-1. Likewise, although not illustrated in FIG. 3 as to not obscure the examples of the disclosure, the heat pipe 103 can be a portion of a set of heat pipes comprising a plurality of heat pipes 103 coupled to a second cold plate 106-N. The sets of heat pipes are illustrated and described in detail in connection with FIG. 2.

In some examples, the cooling system 300 can include a plurality of cold plates 106 in a stacked orientation. As such, the heat transferred from the heat pipes 102 and 103 can flow in the same direction in the negative x-direction. For example, as illustrated by the heat flow direction 309, the heat generated by the DIMMs coupled to the plurality of PCBs 104 can flow in the direction 309 toward the cold plates 106. Specifically, the heat pipe 102 can transfer heat from the DIMMs coupled to the plurality of PCBs 104 to the first cold plate 106-1. Likewise, the heat pipe 103 can transfer heat from the DIMMs coupled to the plurality of PCBs 104 to the second cold plate 106-N. In some examples, the heat can flow in different directions as discussed in connection with FIG. 4.

In some examples, the cooling system 300 can include a plurality of coolant channels 320, 321 that can be coupled to an exterior flow network of the plurality of cold plates 106. As used herein, the term coolant channels refers to a component to direct heat to from a computing device. For example, the plurality of coolant channels 320, 321 can be utilized to remove heat from the plurality of DIMMs. Although not shown in FIG. 3 as to not obscure examples of the disclosure, there can be a plurality of DIMMs (e.g., the DIMMs 214) that can be coupled to the plurality of PCBs 104. In some examples, the plurality of coolant channels 320, 321 can be surrounded by a thermally conductive plastic material of the plurality of cold plates 106. In this way, the thermally conductive plastic material can transfer heat from the plurality of DIMMs into the liquid of the plurality of coolant channels 320,321.

In some examples, the coolant channels 320 can include a liquid sealed area that can transport a liquid from a first location to a second location. As described herein, the plurality of coolant channels 320, 321 can be utilized to remove heat from the plurality of DIMMs. For example, the plurality of heat pipes 102 can transfer heat to the coolant flowing through the plurality of cold plates 106.

Examples of cooling memory modules coupled to printed circuit boards in connection with FIG. 3 describe cooling memory modules coupled to a plurality of PCBs 104 using heat pipes 102 which couple to interleaved DIMMs. The heat from the plurality of DIMMs are transferred in a direction to the plurality of cold plates 106 in a stacked orientation. The cold plates 106 in a stacked orientation wherein the heat from the DIMMs flows in the same direction 309 towards the plurality of stacked cold plates 106. The stacked orientation can cause a uniform DIMM cooling while providing a compact design for cooling heat generating devices.

Figure 4:
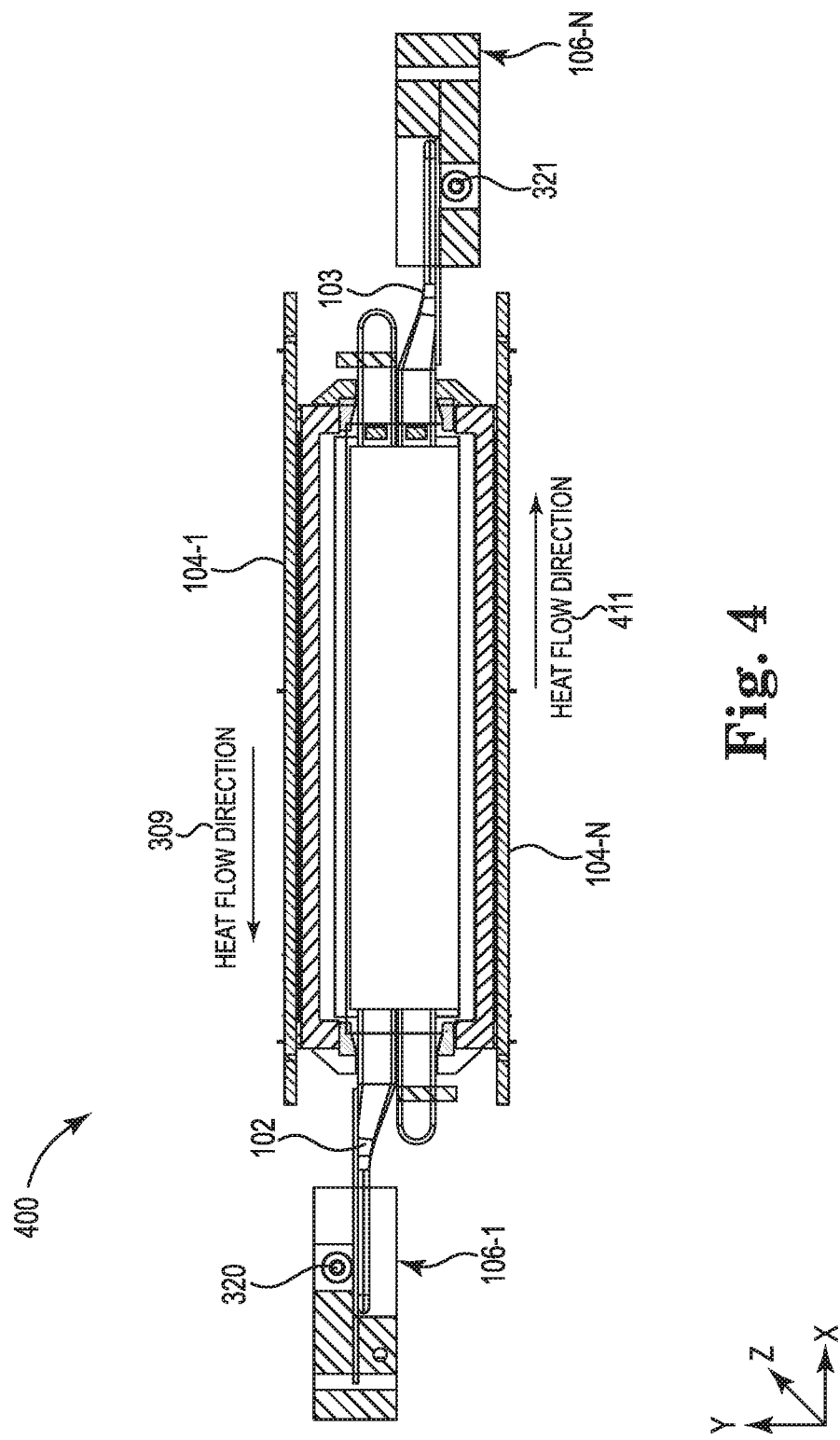
FIG. 4 illustrates an example of a multi-directional cooling system consistent with the present disclosure.

FIG. 4 illustrates an example of a multi-directional cooling system 400 consistent with the present disclosure. The cooling system 400 can include the same or similar elements as cooling system 100 as referenced in FIG. 1, computing device 201 as referenced in FIG. 2, and/or cooling system 300 as referenced in FIG. 3. For example, the cooling system 400 can comprise a plurality of cold plates 106-1 and 106-N, which can be collectively referred to as the plurality of cold plates 106, attached to heat pipes 102 and 103, which are coupled to a plurality of interleaved DIMMs (e.g., the DIMMs 214 of FIG. 2) disposed between a plurality of PCBs 104-1 and 104-N which can be collectively referred to as the plurality of PCBs 104. The plurality of cold plates 106 can be made of thermally conductive plastic material that forms a coolant channel 320 and 321 which can be collectively referred to as the plurality of coolant channels 320, 321. The cooling system 400 can be a representation of a side view of cooling system 100 as referenced in FIG. 1 and/or computing device 201 as referenced in FIG. 2 and/or cooling system 300 as referenced in FIG. 3.

FIG. 4 includes a plurality of DIMMs (e.g., DIMMs 214) disposed between the plurality of PCBs 104, where the heat from the DIMMs is transferred to the plurality of cold plates 106. For example, a first cold plate 106-1 can extract heat from a first portion of DIMMs coupled to the first PCB 104-1 and a second portion of a plurality of DIMMs coupled to a second PCB 104-N and a first set of heat pipes 102 coupled to the first cold plate 106-1 and extending a first direction (the positive x-direction) the length of the first PCB 104-1. Because the DIMMs are interleaved, the second cold plate 106-N may remove heat from the first portion of the DIMMs too. For example, the second cold plate 106-N can extract heat from the first portion of a plurality of DIMMs coupled to the first PCB 104-1 and the second portion of a plurality of DIMMs coupled to the second PCB 104-N where a second set of heat pipes 103 coupled to the second cold plate 106-N extends a second direction (the negative x-direction the length of the second PCB 104-N.

In some examples, the first set of heat pipes 102 can transfer heat to the first cold plate 106-1 in a first direction 309 and the second set of heat pipes 103 can transfer heat to the second cold plate 106-N in a second direction 411. The heat can flow in different directions because the heat pipes removing the heat from the DIMMs connected to the plurality of PCBs 104 are connected to cold plates positioned on opposite ends of the plurality of PCBs 104. That is the first heat pipe 102 is connected to the first cold plate 106-1 and can transfer heat in a first direction 309 (in the negative x-direction) and the second heat pipe 103 is coupled to the second cold plate 106-N and can transfer heat in a second direction 411 (in the positive x-direction). In this example, the first direction 309 and the second direction 411 can be opposite directions.

As illustrated in FIG. 4, the first cold plate 106-1 and the second cold plate 106-N can be positioned opposite each other with the first PCB 104-1 and the second PCB 104-N positioned in between the first 106-1 and the second cold plates 106-N. That is the first cold plate 106-1 and the second cold plate 106-N can be positioned in opposite directions. The first cold plate 106-1 can be positioned in the negative x-direction and the second cold plate 106-N can be positioned in the positive x-direction.

Figure 5:
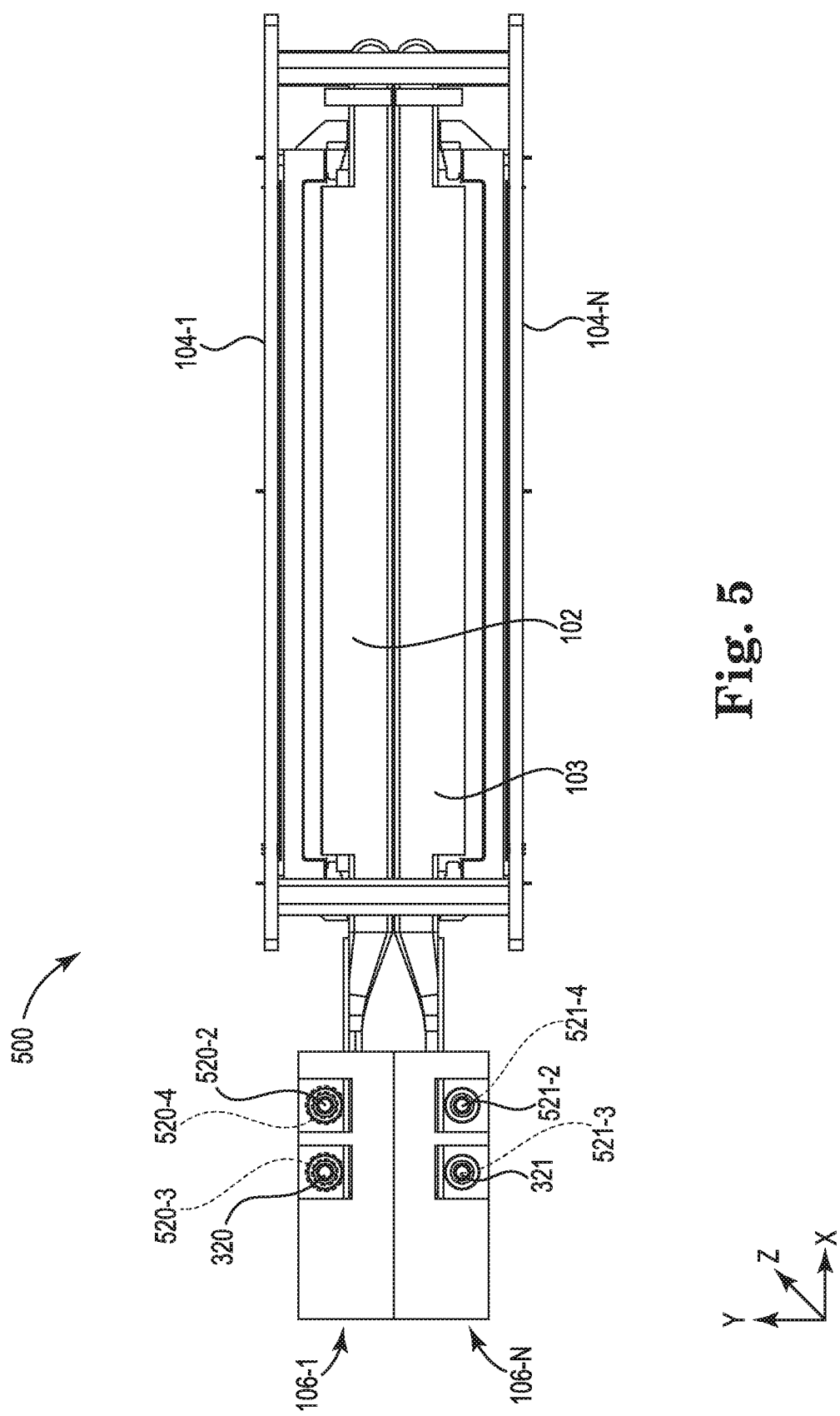
FIG. 5 illustrates an example of a directional cooling system with multiple adjacent coolant flow paths consistent with the present disclosure.

The plurality of cold plates 106 disposed in opposite directions with the plurality of PCBs 104 between them can be referred herein as "flipping" the plurality of cold plates 106. Flipping the plurality of cold plates 106 can reduce the probability of the DIMMs overheating by providing a level temperature for the plurality of DIMMs because the plurality of DIMMs are being cooled from a plurality of directions. In an unflipped orientation (as illustrated in FIGS. 1, 3 and 5), the DIMMs closer to the plurality of cold plates 106 may be cooler as they may get more of the benefit of the plurality of cold plates 106 compared to the plurality of DIMMs further from the plurality of cold plates 106. This can result in more stable temperatures across the plurality of DIMMs when compared to unflipped orientations.

As mentioned, in a flipped orientation, the heat removed by the first set of heat pipes 102 flows in a first direction 309 toward the first cold plate 106-1, and the heat removed by the second set of heat pipes 102 flows in a second direction 411 toward the second cold plate 106-N, and the first direction 309 and the second direction 411 can be opposite each other. In a flipped orientation, the first heat pipe 102 can be substantially parallel to a second heat pipe 103. In this example, the first heat pipe 102 can remove heat from the DIMM and transfer it towards a negative x-direction 309 towards the first cold plate 106-1 while the second set of heat pipes 103 can remove heat from the DIMM and transfer it towards a positive x-direction towards the second cold plate 106-N.

In some examples, the cooling system 400 can include a plurality of coolant channels 320, 321 that can be coupled to an exterior flow network of the plurality of cold plates 106. As described herein, the coolant channel 320 can be utilized to remove heat from computing components that can be coupled to the PCBs 104 of a computing device. In some examples, the plurality of coolant channels 320 can be surrounded by a plurality of thermally conductive plastic materials. In this way, the thermally conductive plastic material can transfer heat from the plurality of DIMMs into the liquid of the plurality of coolant channels 320, 321.

The cooling system 400 has a first coolant channel 320 in a negative z-direction and a second coolant channel 321 in a positive z-direction. The plurality of coolant channels 320, 321 can be located within their respective cold plates 106. In some examples, the respective coolant channels 320 can receive heat from their respective heat pipes 102 and transfer it to a device that can lower the temperature such as the respective cold plates 106.

As mentioned herein, the plurality of heat pipes 102 and 103 can direct heat to multiple cold plates positioned in various orientations. For example, the first set of heat pipes 102 can direct heat to multiple cold plates 106-1, and 106-N positioned on opposite sides of the plurality of PCBs 104. In this way, the first set of heat pipes 102 can transfer heat in opposite directions to the two different cold plates 106-1 and 106-N. Said differently, each heat pipe of the first set of heat pipes 102 can transfer heat to two cold plates. Similarly, when a plurality of cold plates 106 are in a stacked orientation (e.g., as in FIG. 1) the plurality of heat pipes 102 can transfer heat to both cold plates included in the stack. As such, both the first set and the second set of heat pipes 102 and 103 can transfer heat to an individual cold plate as illustrated in FIG. 4, or to multiple cold plates, not expressly illustrated in FIG. 4.

Examples of cooling memory modules coupled to printed circuit boards described in connection with FIG. 4 describe cooling a plurality of PCBs 104 using heat pipes 102 and 103 which couples to interleaved DIMMs. The heat from the plurality of DIMMs are transferred to the plurality of cold plates 106 in a flipped orientation. A first cold plate 106-1 receive heat transferred in a negative x-direction while a second cold plate 106-N can receive heat transferred in a positive x-direction. The cold plates 106 can be positioned opposite each other with the stacked PCBs 104 and interleaved DIMMs positioned between the cold plates 106-1 and 106-N. The first heat pipe 102 can transfer heat from the DIMMS coupled to the plurality of PCBs 104 to the first cold plate 106-1 in the direction 309. The second heat pipe 103 can transfer the heat generated by the DIMMs coupled to the plurality of PCBs 104 to the second cold plate 106-N in the direction 411. The flipped orientation where the heat from the DIMMs head in opposite directions can cause a lower DIMM temperature throughout the length of the DIMM compared to the stacked orientation.

FIG. 5 illustrates an example of a directional cooling system 500 with multiple adjacent coolant flow paths consistent with the present disclosure. In some examples, the cooling system 500 can include the same or similar elements as cooling system 100 as referenced in FIG. 1, computing device 201 as referenced in FIG. 2, cooling system 300 as referenced in FIG. 3, and/or cooling system 400 as referenced in FIG. 4. For example, the cooling system 500 can include a plurality of cold plates 106 attached to a plurality of heat pipes 102 and 103 coupled to a plurality of DIMMs coupled to a plurality of PCBs 104. The plurality of cold plates 106 can be made of thermally conductive plastic material that forms a coolant channel 520.

FIG. 5 illustrates cooling system 500 with a plurality of coolant channels 320, 520-2, 520-3, and 520-4, which can be collectively referred to as the plurality of coolant channels 520, and where coolant channels 520-3 and 520-4 are positioned out of view as indicated by the dashed line. The plurality of coolant channels 520 can be coupled to an exterior flow network of the first cold plate 106-1. Likewise, cooling system 500 is illustrated with a plurality of coolant channels 321, 521-2, 521-3, and 521-4, which can be collectively referred to as the plurality of coolant channels 521, and where coolant channels 521-3 and 521-4 are positioned out of view as indicated by the dashed line. The plurality of coolant channels 521 can be coupled to an exterior flow network of a second cold plate 106-N.

In some examples, each cold plate of the plurality of cold plates 106 may include coolant flow for their respective coolant channels in various directions. For example, the first cold plate 106-1 can utilize coolant flowing in the coolant channel 320 in the negative z-direction, while the coolant channel 520-2 may utilize coolant flowing in the positive z-direction, the coolant channel 520-3 may utilize coolant flowing in the positive z-direction, and the coolant channel 520-4 may utilize coolant flowing in the negative z-direction. Likewise, the second cold plate 106-N can utilize coolant flowing in the coolant channel 321 in the negative z-direction, while the coolant channel 521-2 may utilize coolant flowing in the positive z-direction, the coolant channel 521-3 may utilize coolant flowing in the positive z-direction, and the coolant channel 521-4 may utilize coolant flowing in the negative z-direction. While specific coolant flow direction combinations are described herein, any combinations of coolant flow directions are contemplated.

As described herein, the plurality of coolant channels 520 and 521 can be utilized to remove heat from the plurality of DIMMs (e.g., the DIMMs 214) that can be coupled to a plurality of PCBs 104. The flow of the coolant may vary in direction. In some examples, the plurality of coolant channels 520 and 521 can be surrounded by a thermally conductive plastic material of the plurality of cold plates 106. In this way, the thermally conductive plastic material can transfer heat from the plurality of DIMMs into the liquid of the plurality of coolant channels 520, and 521.

Examples of cooling memory modules coupled to printed circuit boards in connection with FIG. 5 describes cooling memory modules coupled to a plurality of PCBs 104 using a plurality of heat pipes 102 and 103 which couples to interleaved DIMMs. The heat from the plurality of DIMMs are transferred to the plurality of cold plates 106. The plurality of cold plates 106 have a plurality of coolant channels 520 and 521. The plurality of coolant channels 520 and 521 can optimize the cooling of the DIMMs and lower the flow rate.

The Figures herein follow a numbering convention in which the first digit corresponds to the drawing Figure number and the remaining digits identify an element or component in the drawing. Elements shown in the various Figures herein may be capable of being added, exchanged, and/or eliminated so as to provide a number of additional examples of the present disclosure. In addition, the proportion and the relative scale of the elements provided in the Figures are intended to illustrate the examples of the present disclosure and should not be taken in a limiting sense.

As used herein, the designator "N", particularly with respect to reference numerals in the drawings, indicates that a plurality of the particular feature so designated can be included with examples of the disclosure. The designators can represent the same or different numbers of the particular features. Further, as used herein, "a plurality of" an element and/or feature can refer to more than one of such elements and/or features.

The above specification, examples and data provide a description of the methods and applications and use of the system and method of the present disclosure. Since many examples can be made without departing from the spirit and scope of the system and method of the present disclosure, this specification merely sets forth some of the many possible example configurations and implementations.

What is claimed:

1. A cooling system, comprising:
  a first cold plate including a first heat pipe, the first heat pipe disposed on a side of a dual in-line memory module (DIMM), wherein the first heat pipe transfers heat from the DIMM to the first cold plate; and
  a second cold plate on top of which the first cold plate is stacked, the second cold plate including a second heat pipe, the second heat pipe disposed on the side of the DIMM to transfer heat from the DIMM to the second cold plate.

2. The cooling system of claim 1, wherein the first heat pipe is a portion of a first set of heat pipes coupled to the first cold plate and the second heat pipe is a portion of a second set of heat pipes coupled to the second cold plate.

3. The cooling system of claim 2, wherein the first set of heat pipes transfers heat to the first cold plate in a first direction and the second set of heat pipes transfers heat to the second cold plate in a second direction.

4. The cooling system of claim 1, wherein the first heat pipe is parallel to the second heat pipe.

5. The cooling system of claim 1, wherein the first heat pipe is positioned at a first height on the side of the DIMM and the second heat pipe is positioned at a second height on the side of the DIMM.

6. The cooling system of claim 1, comprising a first printed circuit board (PCB) that is positioned parallel to a second PCB, wherein the first PCB and the second PCB are perpendicular to the DIMM.

7. The cooling system of claim 6, wherein a first portion of a plurality of DIMMs are coupled to the first PCB and a second portion of the plurality of DIMMs are coupled to a second PCB such that the first portion of the plurality of DIMMs alternate with the second portion of the plurality of DIMMs.

8. The cooling system of claim 1, wherein a gap pad is positioned around a surface of the side of the DIMM.

9. A computing device, comprising:
  a first printed circuit board (PCB) coupled to a first dual in-line memory module (DIMM) and a second DIMM;
  a second PCB coupled to a third DIMM, wherein the first PCB is positioned on top of the second PCB and the third DIMM is positioned between the first DIMM and the second DIMM;
  a first set of heat pipes extending in a first direction to remove heat from the first DIMM and the third DIMM;
  a second set of heat pipes extending in a second direction to remove heat from the first DIMM and the third DIMM, wherein the first set of heat pipes and the second set of heat pipes are parallel;
  one of the first set of heat pipes is disposed between the first DIMM and the third DIMM;
  one of the second set of heat pipes is disposed between the first DIMM and the third DIMM; and
  wherein the one of the first set of heat pipes and the one of the second set of heat pipes are stacked in a direction perpendicular to the directions that the one of the first set of heat pipes and the one of the second set of heat pipes extend such that the first PCB, one of the one of the first set of heat pipes and the one of the second set of heat pipes, another of the one of the first set of heat pipes and the one of the second set of heat pipes and the second PCB are arranged in order.

10. The computing device of claim 9, further comprising:
  a first cold plate coupled to the first set of heat pipes, wherein the heat removed by the first set of heat pipes is transferred to the first cold plate.

11. The computing device of claim 9, further comprising:
  a second cold plate coupled to the second set of heat pipes, wherein the heat removed by the second set of heat pipes is transferred to the second cold plate.

12. The computing device of claim 9, wherein the first direction and the second direction are opposite directions.

13. The computing device of claim 9, wherein the first set of heat pipes and the second set of heat pipes direct heat from the first and the third DIMMs in opposite directions towards a first cold plate and a second cold plate coupled to the first PCB and the second PCB.

14. The computing device of claim 9, wherein the first set of heat pipes and the second set of heat pipes traverse a length of the first PCB and the second PCB to provide a uniform cooling of the first DIMM and the third DIMM.

15. The computing device of claim 9, wherein a first individual heat pipe from the first set of heat pipes is on a side of the first DIMM at a first distance, and a second individual heat pipe from the second set of heat pipes is parallel to the first individual heat pipe and at a second distance on the side of the first DIMM.

16. The computing device of claim 15, wherein the first individual heat pipe and the second individual heat pipe are between the first DIMM and the third DIMM such that the first and the second individual heat pipes remove heat from the first DIMM and the third DIMM in opposite directions.

17. A cooling system, comprising:
  a first cold plate to extract heat from a first portion of a plurality of dual in-line memory module (DIMMs) coupled to a first Printed Circuit Board (PCB) and a second portion of a plurality of DIMMs coupled to a second PCB;
  a first set of heat pipes coupled to the first cold plate and extending a first direction in a length of the first PCB;
  a second cold plate to extract heat from the first portion of a plurality of DIMMs coupled to the first PCB and the second portion of a plurality of DIMMs coupled to the second PCB; and a second set of heat pipes coupled to the second cold plate and extending a second direction in a length of the second PCB, wherein a respective one of the first set of heat pipes and a respective one of the second set of heat pipes are stacked in a direction perpendicular to the directions that the first set of heat pipes and the second set of heat pipes extend such that the first PCB, one of the respective one of the first set of heat pipes and the respective one of the second set of heat pipes, another of the respective one of the first set of heat pipes and the respective one of the second set of heat pipes and the second PCB are arranged in order.

18. The cooling system of claim 17, wherein the first cold plate and the second cold plate are positioned opposite each other with the first PCB and the second PCB positioned in between the first and the second cold plates.

19. The cooling system of claim 17, wherein the heat removed by the first set of heat pipes flows in a first direction toward the first cold plate, and the heat removed by the second set of heat pipes flows in a second direction toward the second cold plate.

20. The cooling system of claim 19, wherein the first direction and the second direction are opposite each other.

\* \* \* \* \*